US012628335B2

(12) United States Patent
Fishburn et al.

(10) Patent No.: US 12,628,335 B2
(45) Date of Patent: May 12, 2026

(54) SUPPORT LAYER FOR SMALL PITCH FILL

(71) Applicant: Applied Materials, Inc., Santa Clara, CA (US)

(72) Inventors: Fredrick Fishburn, Aptos, CA (US); Sung-Kwan Kang, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 471 days.

(21) Appl. No.: 18/122,373

(22) Filed: Mar. 16, 2023

(65) Prior Publication Data

US 2023/0309295 A1      Sep. 28, 2023

Related U.S. Application Data

(60) Provisional application No. 63/322,732, filed on Mar. 23, 2022.

(51) Int. Cl.
*H10B 12/00*          (2023.01)

(52) U.S. Cl.
CPC ......... *H10B 12/488* (2023.02); *H10B 12/053* (2023.02); *H10B 12/34* (2023.02)

(58) Field of Classification Search
CPC ..... H10B 12/053; H10B 12/34; H10B 12/488
See application file for complete search history.

(56) References Cited

U.S. PATENT DOCUMENTS

| | | | |
|---|---|---|---|
| 7,723,755 B2 | 5/2010 | Lee et al. | |
| 9,960,275 B1 | 5/2018 | Chang et al. | |
| 11,295,786 B2 | 4/2022 | Kang et al. | |
| 2011/0220994 A1 | 9/2011 | Parekh et al. | |
| 2012/0231626 A1 | 9/2012 | Lee et al. | |
| 2019/0181222 A1 | 6/2019 | Liao | |
| 2019/0206982 A1 | 7/2019 | Wu et al. | |
| 2019/0378837 A1* | 12/2019 | Miao .................... | H10D 30/024 |

(Continued)

FOREIGN PATENT DOCUMENTS

| | | |
|---|---|---|
| CN | 102237264 A | 11/2011 |
| KR | 20070028619 A | 3/2007 |
| KR | 100949897 B1 | 3/2010 |

(Continued)

OTHER PUBLICATIONS

PCT International Search Report and Written Opinion in PCT/US2023/015637 dated Jul. 11, 2023, 9 pages.

*Primary Examiner* — Hoai V Pham
(74) *Attorney, Agent, or Firm* — SERVILLA WHITNEY LLC

(57) ABSTRACT

Provided is a DRAM device having a support layer to hold the bWL features before being filled with the electrode metal. The support layer keeps the structure supported from the top surface but does not prevent the gap fill. A temporary gap-fill material is first deposited in the bWL gaps and then recessed to expose the top edges. A support layer material is then deposited on the structure by plasma enhanced chemical vapor deposition (PECVD). The device is then patterned orthogonal and with pitch greater than the bWL pitch. The temporary gap-fill material is then removed, forming support beams comprising the support material. A metal can then be deposited to fill the bWL gaps under the support beams.

14 Claims, 7 Drawing Sheets

(56)                        References Cited

U.S. PATENT DOCUMENTS

| | | |
|---|---|---|
| 2021/0066466 A1 | 3/2021 | Kwon et al. |
| 2021/0074705 A1 | 3/2021 | Tang et al. |

FOREIGN PATENT DOCUMENTS

| | | |
|---|---|---|
| KR | 20110121360 A | 11/2011 |
| KR | 20120102932 A | 9/2012 |
| KR | 20180010588 A | 1/2018 |
| KR | 20180117714 A | 10/2018 |
| KR | 20190063484 A | 6/2019 |
| KR | 20210094330 A | 7/2021 |
| TW | 201816896 A | 5/2018 |
| TW | 202205537 A | 2/2022 |

* cited by examiner

10

Provide Substrate — 12

Deposit Temporary Fill Layer — 14

Recess Temporary Fill Layer — 16

Deposit Support Layer Material — 18

Pattern Support Layer — 20

Remove Temporary Fill Layer — 22

Deposit Gapfill Material InTrenches — 24

Remove Support Layer Material — 26

Recess Gapfill Material — 28

SUPPORT LAYER FOR SMALL PITCH FILL

CROSS-REFERENCE TO RELATED APPLICATIONS

This application claims priority to U.S. Provisional Application No. 63/322,732, filed Mar. 23, 2022, the entire disclosure of which is hereby incorporated by reference herein.

TECHNICAL FIELD

Embodiments of the present disclosure pertain to the field of electronic devices and electronic device manufacturing. More particularly, embodiments of the disclosure provide electronic devices including a support layer to hold buried wordline features before filled and methods of forming same.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating billions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 8 Gigabits. Limitations on cell size reduction include the passage of both active and passive word lines through the cell, the size of the cell capacitor, and the compatibility of array devices with non-array devices.

One difficulty with DRAM is that the buried wordline needs to be a low resistance metal which can withstand high temperatures. Soon the buried wordline pitch will be 30 nm or less, and further generations continue to shrink. The mechanical stability of the buried wordline is already challenged and getting worse.

Current methods use lower stress films or "V" shape gaps, but these methods result in higher resistance. Even with this there is bending, and any imbalance in the gap to be filled results in worse bending of the lines. This bending not only results in imbalance in the width of the gap that is filled with metal but also causes misalignment locally in the line between gaps. In the case of buried wordline, this is misalignment of the silicon which forms the cell and bitline contact regions.

Thus, there is a need in the art for improved DRAM and methods of manufacture.

SUMMARY

One or more embodiments of the disclosure are directed to a memory device. In one or more embodiments, the memory comprises: a substrate with a substrate surface having a plurality of trenches extending a depth into the substrate, each trench including a bottom and sidewall; and a beam extending on the substrate surface between the plurality of trenches, the beam comprising a support layer.

Additional embodiments of the disclosure are directed to a method of forming a memory device. In one or more embodiments, the method comprises: providing a substrate having plurality of trenches thereon; depositing a temporary fill layer on a top surface of the substrate to seal the plurality of trenches; recessing the temporary fill layer to form a recess in each of the plurality of trenches; depositing a support layer material in the recess; removing the temporary fill material to expose a sidewall and a bottom surface of each of the plurality of trenches; depositing a gapfill material in the plurality of trenches; and removing the support layer material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
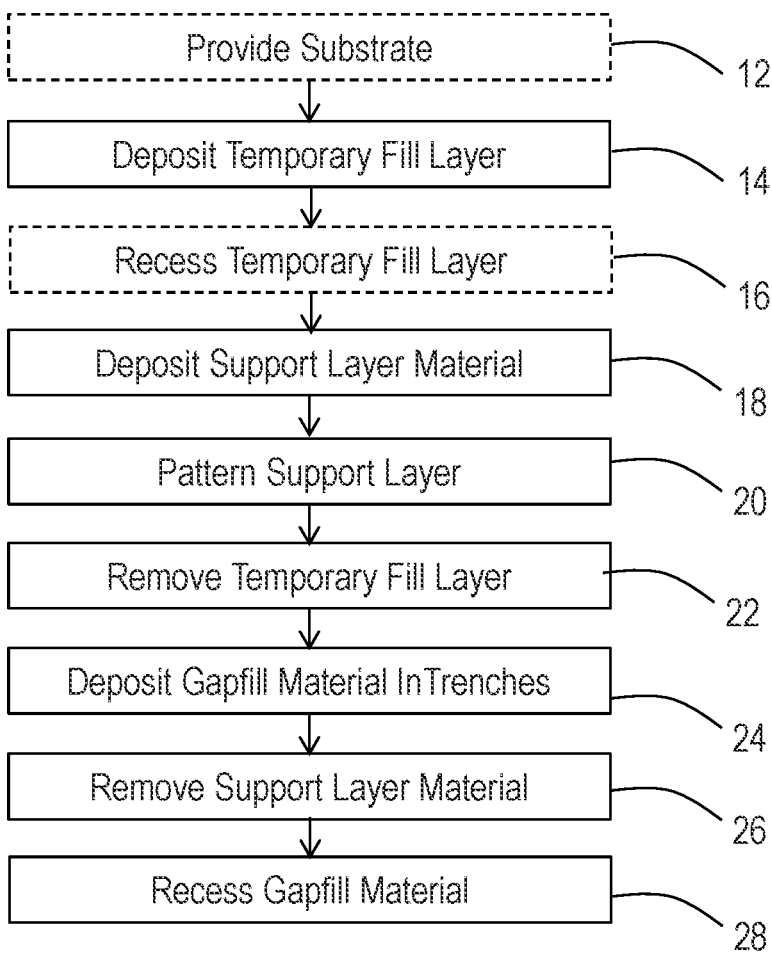
FIG. 1 illustrates a process flow diagram for a method for forming a device according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In the buried word line (bWL) a word line is buried below the surface of a semiconductor substrate using a metal as a gate electrode.

One difficulty with DRAM is that the buried wordline (bWL) needs to be a low resistivity metal, which can withstand high temperatures. Soon the bWL pitch will be thirty nanometers or less, and further generations continue to shrink. The mechanical stability of the bWL is already challenged and getting worse. Current methods use lower stress films or "V" shape gaps, but these result in higher resistivity. Even with this, there is bending, and any imbalance in the gap to be filled results in worse bending of the lines. This bending not only results in imbalance in the width of the gap that is filled with metal but also causes misalignment locally in the line between gaps. In the case of bWL, this is misalignment of the silicon, which forms the cell and BL contact regions. One or more embodiments advantageously provide a method to create a 30 nm or smaller pitch bWL feature with nearly vertical aspect ratio of >10:1 that can be filled with stressful films without experiencing line bending, or feature collapse; especially in the case of line or space imbalance between features.

In one or more embodiments, a support layer is advantageously introduced to hold the bWL features before being filled. The support layer keeps the structure supported from the top surface but does not restrict the gap fill. In one or more embodiments, the support layer limits elastic deformation of the structure during fill.

In one or more embodiments, a low stress temporary gap-fill material is first deposited in the bWL gaps and then recessed to expose the top edges. A support layer material is then deposited on the structure by plasma enhanced chemical vapor deposition (PECVD). The device is then patterned orthogonal and with pitch greater than the bWL pitch. The temporary gap-fill material is then removed, forming support beams comprising the support material. A metal can then be deposited to fill the bWL gaps under the support beams.

The embodiments of the disclosure are described by way of the Figures, which illustrate devices (e.g., DRAM) and processes for forming DRAMs in accordance with one or more embodiments of the disclosure. The processes shown are merely illustrative possible uses for the disclosed processes, and the skilled artisan will recognize that the disclosed processes are not limited to the illustrated applications.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the Surface through which the implantation takes place. Thus, the regions illustrated in the figures are schematic in nature and their shapes may be not intended to illustrate the actual shape of a region of a device and are not intended to limit the scope of example embodiments.

FIG. 1 depicts a process flow diagram of a method 10 of manufacturing an electronic device in accordance with one or more embodiments of the present disclosure. With reference to FIG. 1, method 10 begins at operation 12 by providing a DRAM substrate. As used herein, the term "provided" means that the substrate is made available for processing (e.g., positioned in a processing chamber). At operation 14, a temporary gap-fill material deposited in the trenches. At operation 16, the temporary gap-fill material is optionally recessed. At operation 18, a support layer material is deposited on the structure. At operation 20, the support layer material is patterned. At operation 22, the temporary gap-fill material is removed. At operation 24, a metal is deposited to fill the trenches. At operation 26, the support layer material is removed. At operation 28, the gapfill material is recessed.

In some embodiments, memory device 100 is a DRAM structure and the plurality of trenches 108 are buried wordline (bWL) gaps. The buried wordline structure illustrated in the Figures is similar to finFET devices. Thus, in one or more embodiments, the support layer 114 permits narrow width fins with greatly reduced fin bending. The concept may also be applied to the variable widths of low-K material between the variable gaps to be filled with interconnect metal. Accordingly, while the Figures depict DRAM with buried wordline (bWL), the invention is not limited to only such structures. Instead, in one or more embodiments, a support layer is formed on a semiconductor structure having high aspect ratio/small critical dimension (CD) trenches. In such structures having high aspect ratio/small critical dimension (CD) trenches, the process of filling the trenches with a gapfill material can cause the small pitch lines to bend. Thus, the support layer of one of more embodiments holds the small pitch trenches before being filled with a gapfill material (e.g., metal). The support layer of one or more embodiments keeps the structure supported from the top surface but does not prevent the gap fill.

Figure 2:
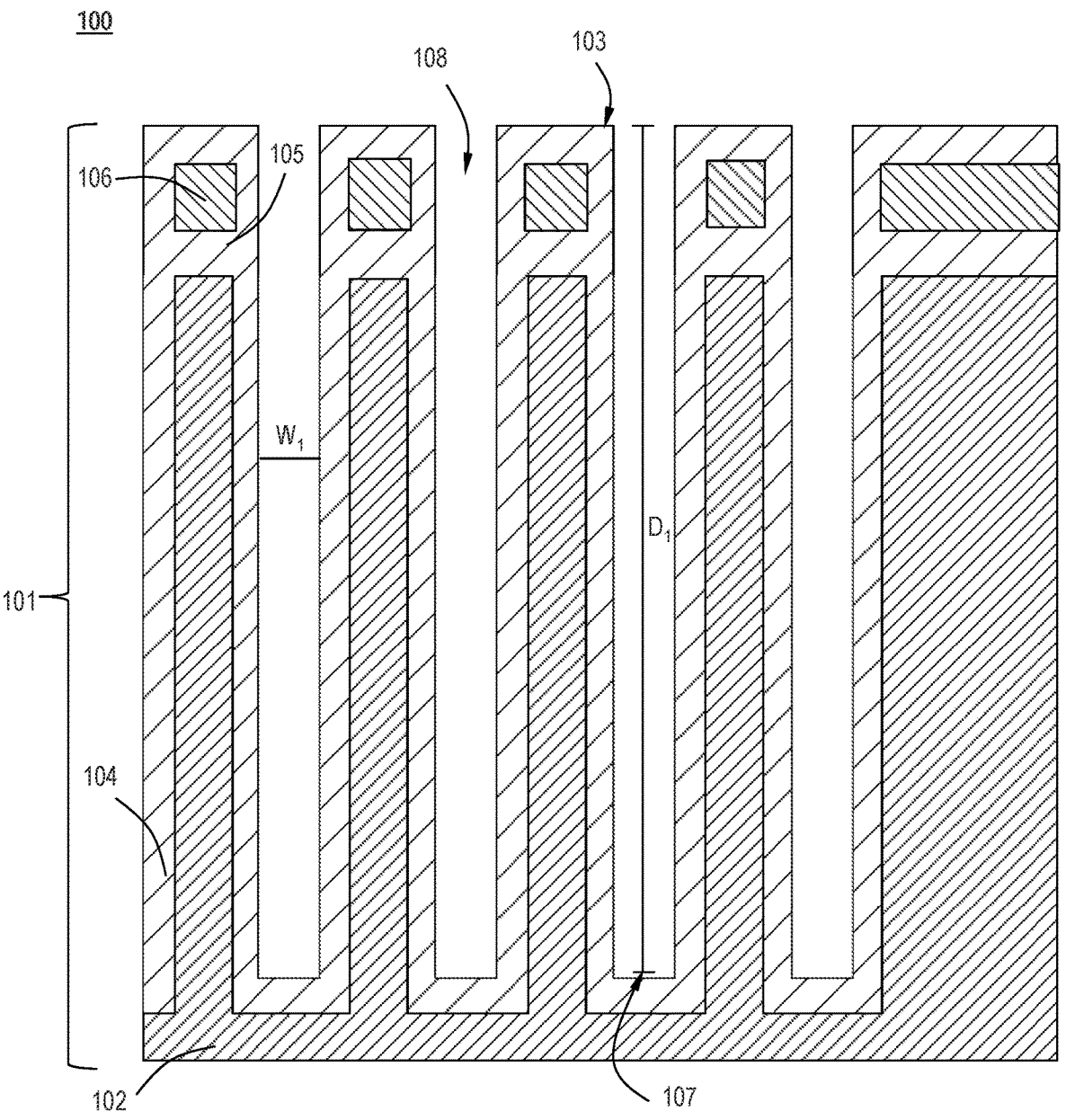
FIG. 2 illustrates a cross-section view of a DRAM device according to one or more embodiments.

FIG. 2 illustrates a cross-section view of a memory device 100. The skilled artisan will recognize that the stacks illustrated in the drawings are an exemplary portion of a DRAM device taken across the buried wordline (bWL). With reference to FIGS. 1 and 2, DRAM devices 100 include a buried wordline stack 101 which comprises an active region 102 and a gate oxide layer 104. A nitride layer 106 is on a pad oxide 105 on the buried wordline stack 101. The active region 102 may comprise any suitable material known to the skilled artisan. In one or more embodiments, the active region 102 comprises silicon (Si).

As illustrated in FIG. 2, a plurality of trenches 108 are located between adjacent gate stacks 101. The trenches 108 each have a bottom and sidewall. The trenches 108 may have any suitable shape, including, but not limited to, square, tapered, and the like. The trenches 108 can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The plurality of trenches 108 may be formed so as to have a width within a range of about 3 to about 30 nm, including, but not limited to a range of about 3 nm to about 20 nm, about 3 nm to about 15 nm, about 3 nm to about 10 nm, about 3 nm to about 8 nm, or about 3 nm to about 5 nm. As will be recognized by one of skill in the art, the width of the plurality of trenches 108 is defined by a distance $W_1$ from one sidewall to another sidewall. As will be recognized by one of skill in the art, the depth of the plurality of trenches 108 is defined by the distance Di from the active region surface 103 to the bottom 107 of the plurality of trenches 108.

With reference to FIG. 2, a gate oxide layer 104 is conformally formed on the active region 102, on the active region surface 103 and along the sidewall and bottom 107 of the plurality of trenches 108. In one or more embodiments, the gate oxide layer 104 may comprise any suitable material known to the skilled artisan. In one or more embodiments, the gate oxide layer 104 comprises one or more of an oxide, a low-κ dielectric material, or a high-κ dielectric material. In some embodiments, the gate oxide layer 104 comprises an annealed oxide material. In other embodiments, the gate oxide layer 105 comprises one or more of silicon oxynitride (SiON), silicon oxide, or a high-κ dielectric material. While the term "silicon oxide" may be used to describe the gate oxide layer 104, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, tungsten oxide, zirconium oxide, aluminum oxide, hafnium oxide, and the like.

In one or more embodiments, the term "high-κ dielectric" refers to a material with a high dielectric constant (as compared to, e.g., silicon dioxide). In one or more embodiments, the high-κ dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), hafnium silicon oxide (HfSiO), or zirconium silicon oxide (ZrSiO).

In one or more embodiments, the gate oxide layer 104 has a thickness in a range of about 1 nm to about 10 nm, or in a range of about 5 nm to about 7 nm, including about 1 nm, about 2 nm, about 3 nm, about 4 nm, about 5 nm, about 6 nm, about 7 nm, about 8 nm, about 9 nm, or about 10 nm.

Figure 3:
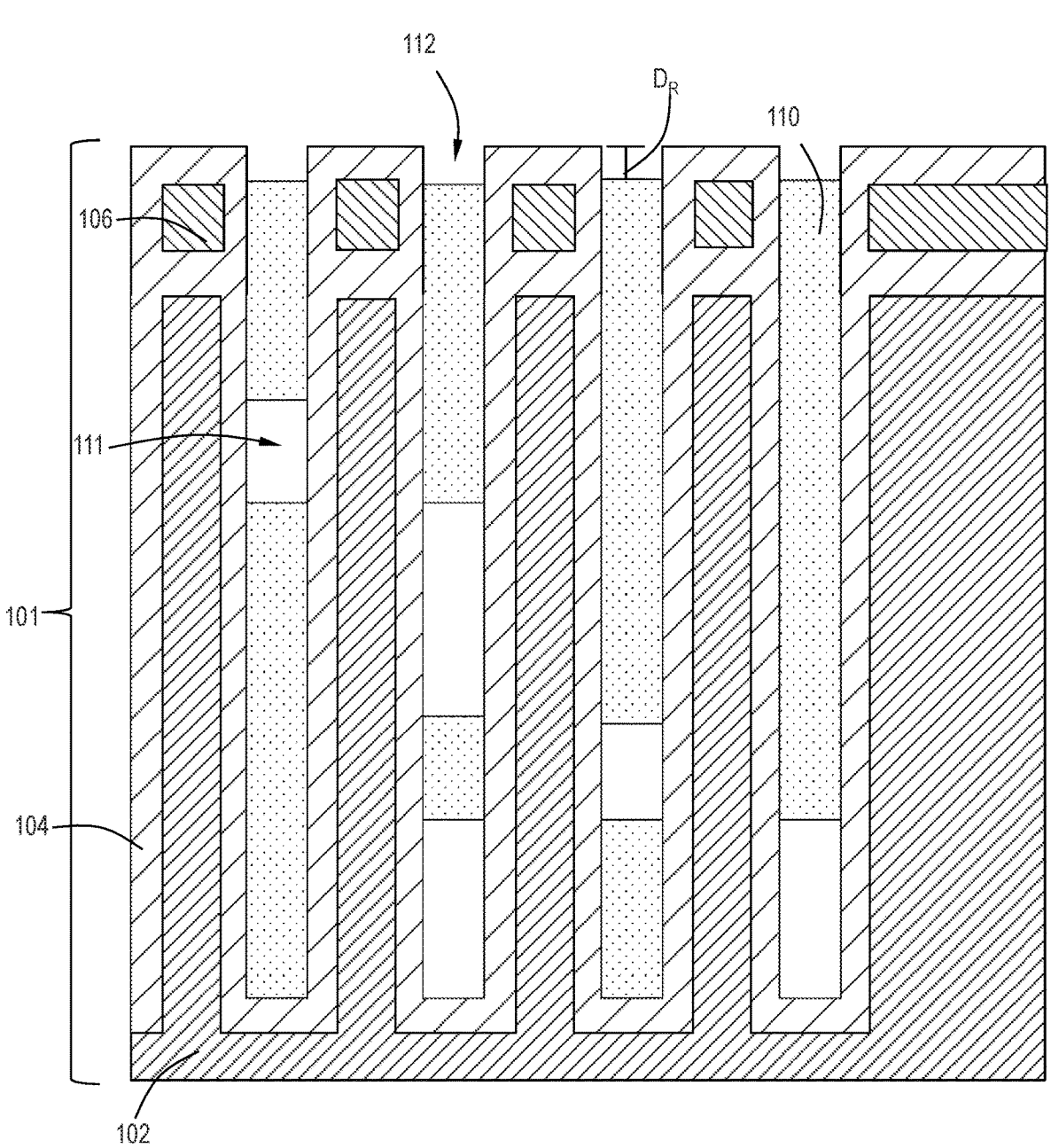
FIG. 3 illustrates a cross-section view of a DRAM device according to one or more embodiments.

With reference to FIG. 1 and FIG. 3, in one or more embodiments, at operation 14, a temporary fill layer 110 is deposited on the top surface of the gate oxide layer 104 to seal the top of the plurality of trenches 108. The temporary fill layer 110 may comprise any suitable material known to the skilled artisan. In one or more embodiments, the temporary fill layer 110 is a low stress material. In one or more embodiments, the temporary fill layer 110 comprises one or more of a spin-on carbon, a CVD carbon, a CVD silicon germanium (SiGe), poly-silicon, n-doped poly-silicon, and the like.

The temporary fill layer 110 may be formed by any suitable deposition process known to the skilled artisan. In one or more embodiments, the deposition process includes atomic layer deposition (ALD), molecular layer deposition (MLD), physical vapor deposition (PVD), chemical vapor deposition (CVD), or the like.

The process of forming the temporary fill layer 110 may begin by exposing the substrate to a precursor for a period of time. In some embodiments, the precursor is supplied without the use of a plasma.

In one or more embodiments, when the temporary fill layer 110 is deposited buried voids 111 may be formed. As long as these voids remain below the level of overburden removal, the support layer can still be blocked from deposition in the gap.

Referring to FIG. 1, in some embodiments, when the temporary fill layer 110 is deposited with an overburden, at operation 16, the overburden of the temporary fill layer 110 must be removed to form a recess 112. The overburden of the temporary fill layer 110 may be removed by any means known to the skilled artisan. In one or more embodiments, the overburden of the temporary fill layer 110 is removed by recessing to form the recess 112. In one or more embodiments, the temporary fill layer 110 is removed from the top surface of device 100 to expose at least the top edge of the buried wordline stack 101. In one or more embodiments, the temporary fill layer 110 is recessed a recess distance, DR, to form the recess 112. The recess distance, DR, which is also the depth of the recess 112, can be any suitable distance. In some embodiments, the recess distance DR is in a range of from 0 nm to 60 nm, or in a range of from greater than 0 nm to 60 nm, including 2 nm, 4 nm, 6 nm, 8 nm, 10 nm, 15 nm, 20 nm, 25 nm, 30 nm, 35 nm, 40 nm, 50 nm, or 60 nm.

Figure 4:
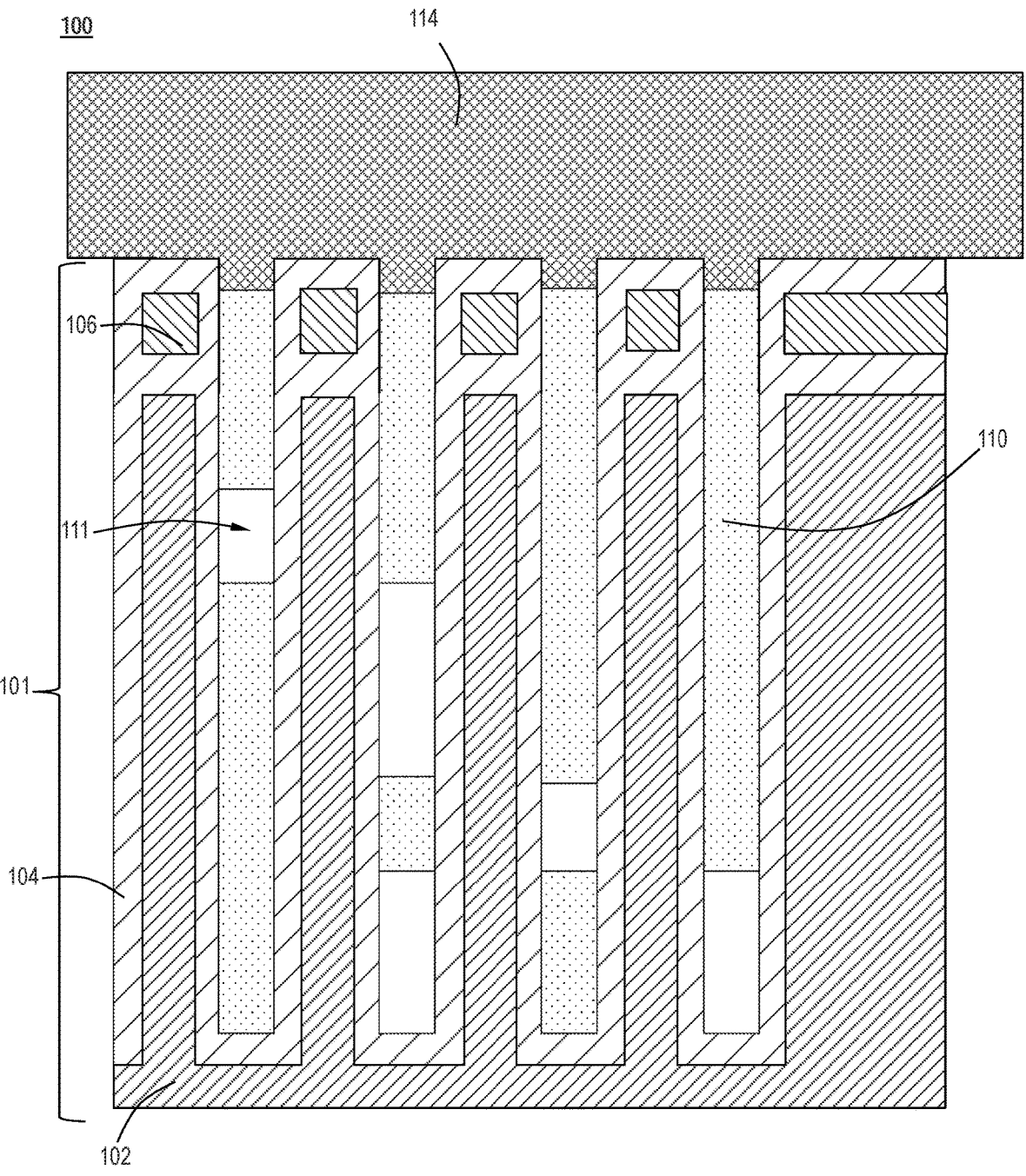
FIG. 4 illustrates a cross-section view of a DRAM device according to one or more embodiments.

Referring to FIG. 1 and FIG. 4, at operation 18, a support layer 114 is deposited in the recess 112. The support layer 114 is formed as a beam of material. The support layer 114 may be formed by any suitable deposition means known to the skilled artisan. In one or more embodiments, the support layer 114 is formed by plasma enhanced chemical vapor deposition (PECVD). The support layer 114 may comprise any suitable material known to the skilled artisan. In one or more embodiments, the support layer 114 comprises one or more of poly-silicon, a low temperature oxide, a high-κ material, a metal, a metal nitride, p-doped poly-silicon, and the like.

Figure 5:
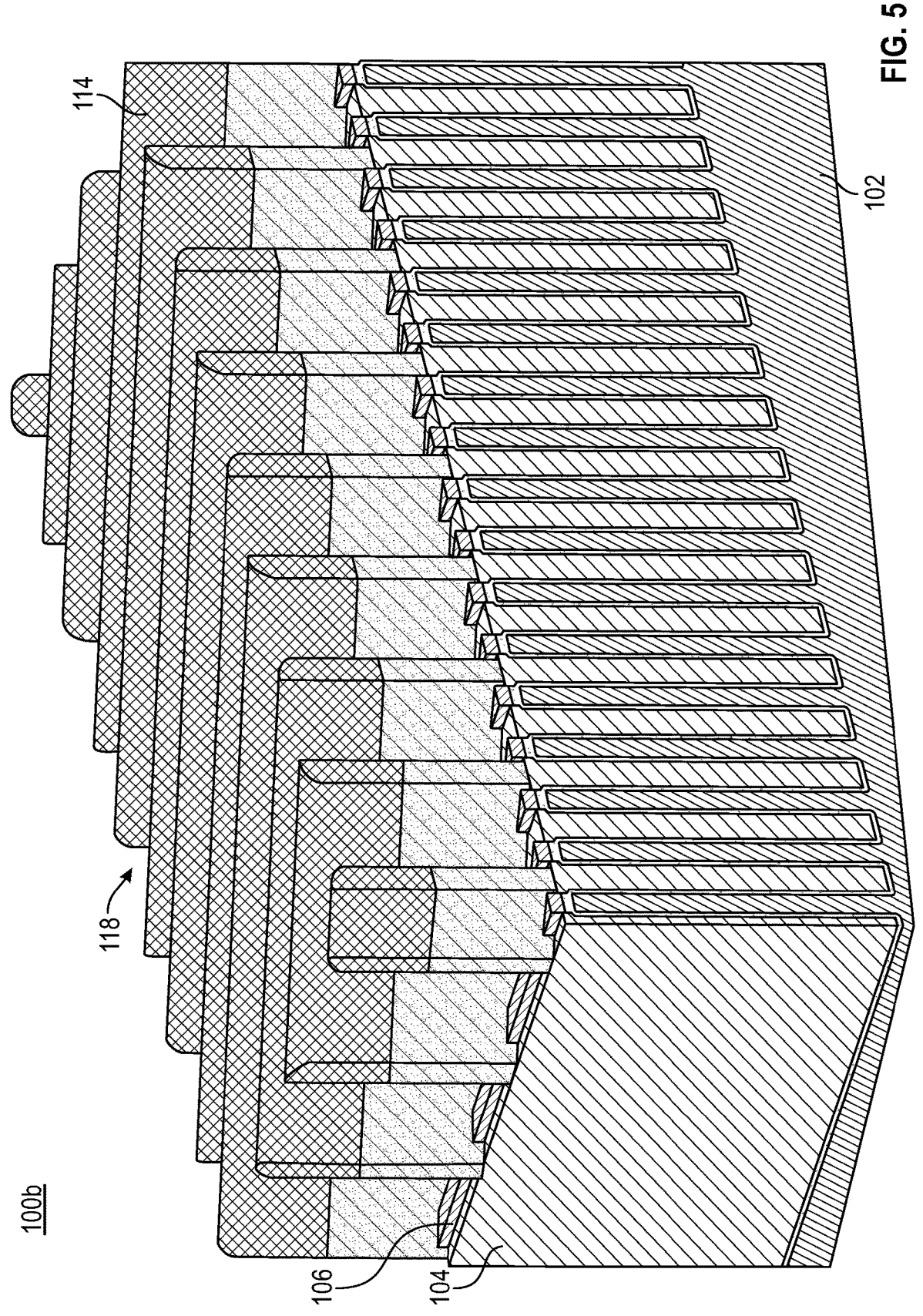
FIG. 5 illustrates a cross-section view of a DRAM device according to one or more embodiments.

With reference to FIG. 1 and FIG. 5, at operation 20, the device is patterned and etched to narrow the lines and widen the space. This patterning can be self-aligned double patterning (SADP) where the spacer used for the double patterning can directly be used as the support layer or the spacer can be used as the mask to etch the underlying support layer, as shown in FIG. 5.

Figure 6:
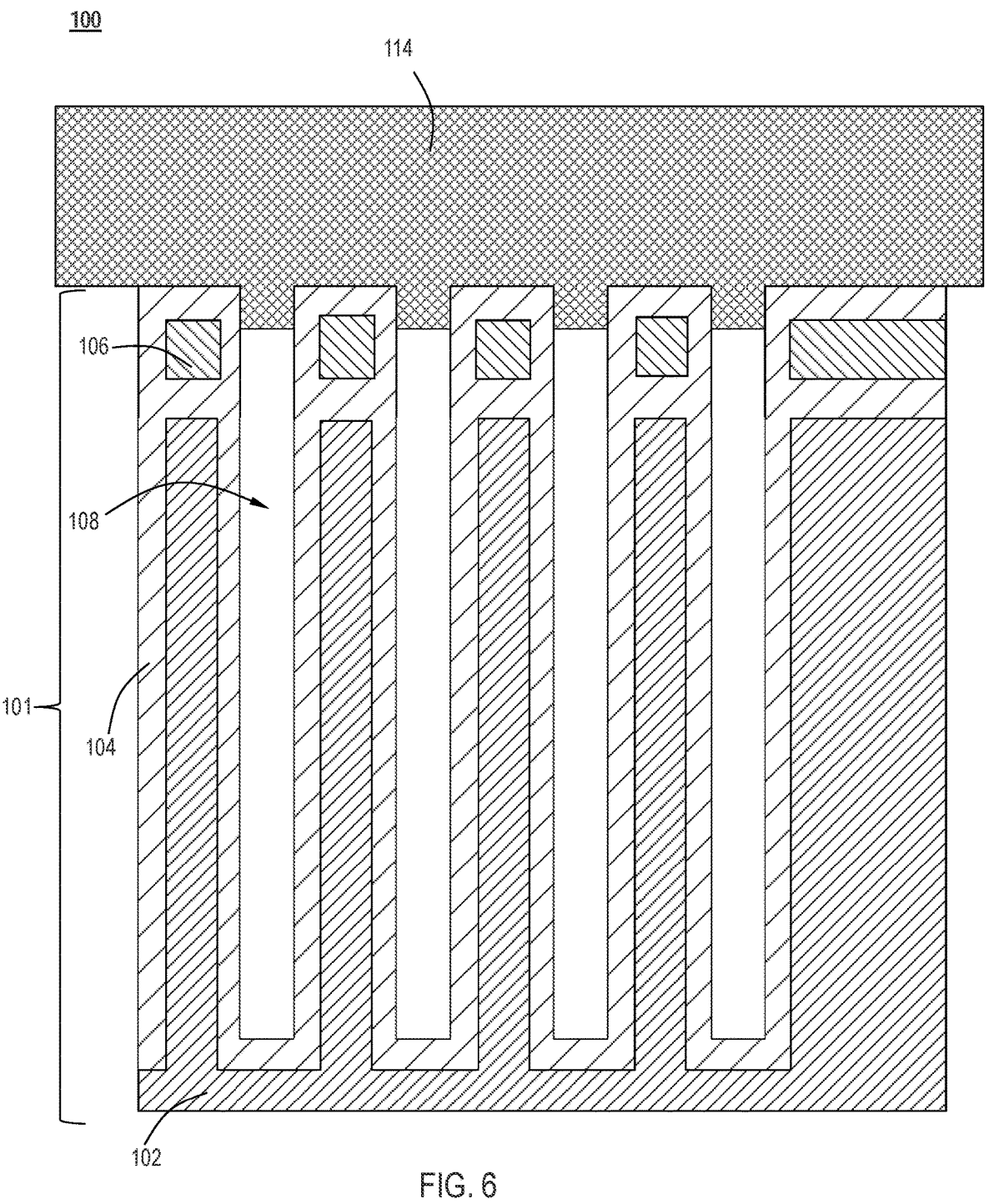
FIG. 6 illustrates a cross-section view of a DRAM device according to one or more embodiments.

FIG. 6 is a cross-section view 100b of the DRAM device. Referring to FIG. 1 and FIG. 6 at operation 22, the temporary support layer 110 is removed to expose the plurality of trenches 108. The temporary support layer 110 may be removed by any suitable means known to the skilled artisan. In one or more embodiments, the temporary support layer 110 is removed isotropically, selectively under the support layer 114 and in the plurality of trenches 108.

Figure 7:
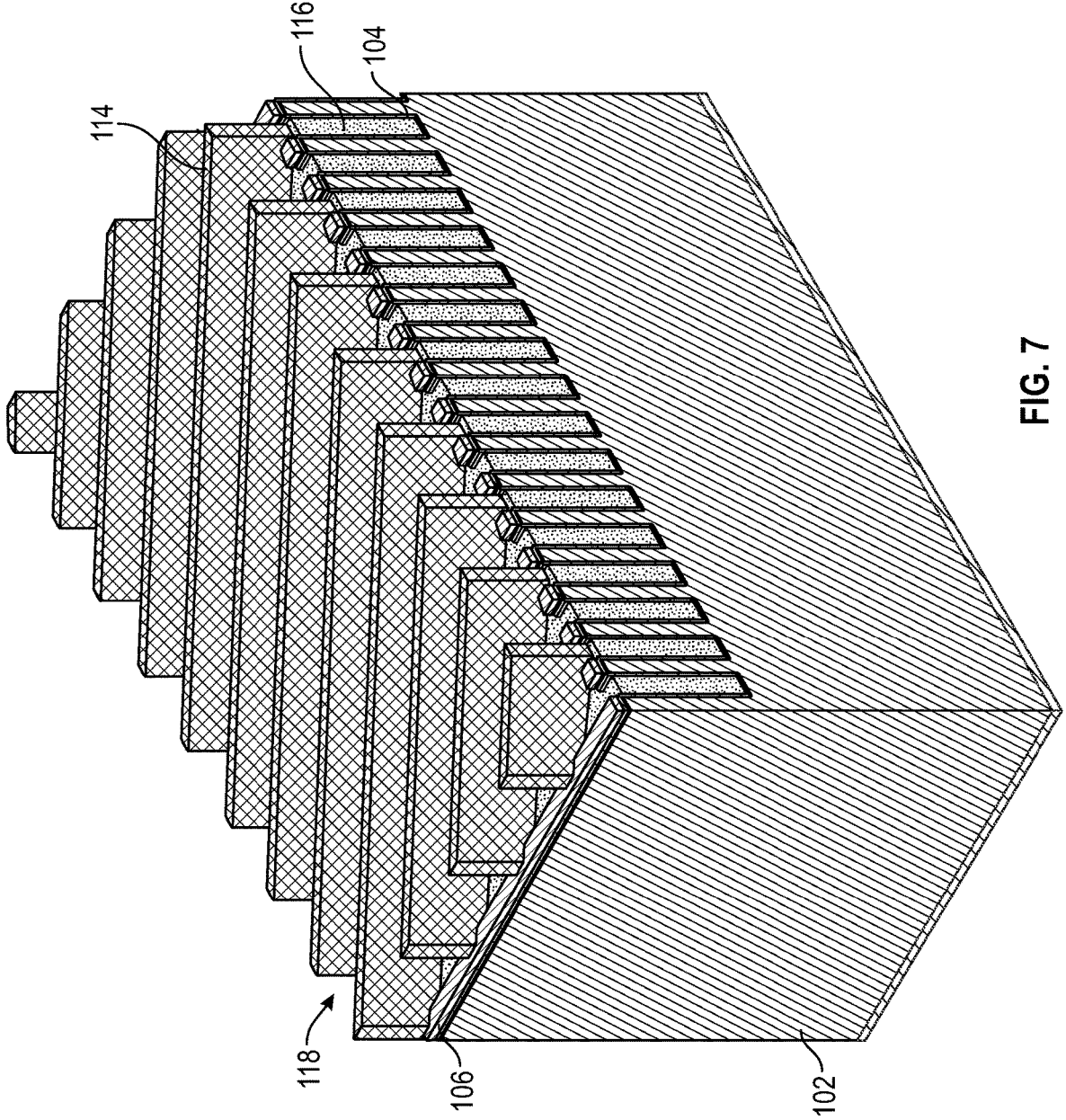
FIG. 7 illustrates a cross-section view of a DRAM device according to one or more embodiments.

With reference to FIG. 1 and FIG. 7, at operation 24, a gapfill material 116 is deposited to fill the plurality of trenches 108. The gapfill material 116 may comprise any suitable material required in the final device fabrication. In one or more embodiments, the gapfill material 116 does not interact with the support material 114. In other words, the support material 114 is inert to the gapfill material 116. In one or more embodiments, the gapfill material 116 comprises one or more of a metal nitride including, but not limited to, titanium nitride (TiN), tantalum nitride (TaN), tantalum silicon nitride (TaSiN), and the like, a metal including, but not limited to, molybdenum (Mo) and tungsten (W), and the like. In one or more embodiments, the gapfill material 116 comprises one or more of, titanium nitride (TiN), tantalum nitride (TaN), tantalum silicon nitride (TaSiN), molybdenum (Mo), tungsten (W), and the like. In one or more embodiments, the gapfill material 116 is deposited to fill the plurality of trenches 108 but to leave a gap 118 between the adjacent beams of support layer 114.

Referring to FIG. 1 and FIG. 8, at operation 26, the gapfill material 116 is partially or fully removed from around the beams of support layer 114 so that the support layer 114 can be removed effectively. In one or more embodiments, after the beams of support layer 114 are removed, the gapfill material 116 is further recessed in the plurality of trenches 108 to its desired depth.

In one or more embodiments, a plasma processing apparatus is used to generate the plasma and treat the metal film with ammonia plasma. In one or more embodiments, the plasma processing apparatus is a stand-alone tool and is not part of a cluster tool. In other embodiments, the plasma processing apparatus is part of a cluster tool.

Several well-known cluster tools which may be adapted for the present disclosure are the Olympia®, the Continuum®, and the Trillium®, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), plasma treatment, etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

One or more embodiments provide a non-transitory computer readable medium including instructions, that, when executed by a controller of a processing chamber, causes the processing chamber to perform the operations of: provide a substrate having plurality of trenches thereon; deposit a conformal gate oxide layer on the substrate; deposit a temporary fill layer on a top surface of the gate oxide layer to seal the plurality of trenches; recess the temporary fill layer to form a recess in each of the plurality of trenches; deposit a support layer material in the recess and on the top surface of the gate oxide; remove the temporary fill material to expose the gate oxide layer on a sidewall and a bottom surface of each of the plurality of trenches; deposit a gapfill material in the plurality of trenches; and remove the support layer material.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A memory device comprising:
a substrate with a substrate surface having a plurality of trenches extending a depth into the substrate, each of the plurality of trenches including a top portion, a bottom portion with a bottom surface, and a sidewall surface;
a gate oxide layer on the top portion, the bottom portion, the bottom surface, and the sidewall surface of each of the plurality of trenches;
a gapfill material on the gate oxide layer and in each of the plurality of trenches; and
a beam extending on a top surface of the gate oxide layer and between the plurality of trenches in the top portion of each of the plurality of trenches, the beam comprising a support layer.

2. The memory device of claim 1, wherein the support layer comprises one or more of poly-silicon, a low temperature oxide, a high-K material, a metal, a metal nitride, and p-doped poly-silicon.

3. The memory device of claim 1, wherein the gate oxide layer comprises one or more of an oxide, a low-K dielectric material, a high-K dielectric material, and an annealed oxide material.

4. The memory device of claim 3, wherein the gate oxide layer has a thickness in a range of from 5 nm to 7 nm.

5. The memory device of claim 1, wherein the recessed gapfill material comprises one or more of titanium nitride (TiN), tantalum nitride (TaN), tantalum silicon nitride (TaSiN), molybdenum (Mo), and tungsten (W).

6. The memory device of claim 1, wherein the plurality of trenches has an aspect ratio greater than or equal to 10:1.

7. A memory device comprising:
a plurality of buried worldline gate stacks on a semiconductor substrate, each of the plurality of buried wordline gate stacks comprising an active region, a nitride layer, and a pad oxide;
a plurality of trenches adjacent to the plurality of buried wordline gate stacks, the plurality of trenches extending a depth from a top surface of the nitride layer into the semiconductor substrate, each of the plurality of trenches including a top portion, a bottom portion with a bottom surface, and a sidewall surface;
a gate oxide layer on the plurality of buried wordline gate stacks and on the bottom surface and the sidewall surface of the plurality of trenches;
a gapfill material on the gate oxide layer and in each of the plurality of trenches; and
a beam on a top surface of the plurality of buried wordline gate stacks and between the plurality of trenches in the top portion of the plurality of trenches, the beam comprising a support layer.

8. The memory device of claim 7, wherein the support layer comprises one or more of poly-silicon, a low temperature oxide, a high-K material, a metal, a metal nitride, and p-doped poly-silicon.

9. The memory device of claim 7, wherein the gate oxide layer comprises one or more of an oxide, a low-K dielectric material, a high-K dielectric material, and an annealed oxide material.

10. The memory device of claim 7, wherein the gate oxide layer has a thickness in a range of from 5 nm to 7 nm.

11. The memory device of claim 7, wherein the gapfill material comprises one or more of titanium nitride (TiN), tantalum nitride (TaN), tantalum silicon nitride (TaSiN), molybdenum (Mo), and tungsten (W).

12. The memory device of claim 7, wherein the plurality of trenches have an aspect ratio greater than or equal to 10:1.

13. The memory device of claim 7, wherein a recess in each of the plurality of trenches has a depth in a range of from greater than 0 nm to 15 nm.

14. The memory device of claim 1, wherein the memory device is a DRAM device.

* * * * *